(12) United States Patent
Kavalipurapu et al.

(10) Patent No.: US 10,783,941 B1
(45) Date of Patent: Sep. 22, 2020

(54) FLOATING BLOCK SELECT BASED PROGRAMMING TIME (TPROG)

(71) Applicant: Intel Corporation, Santa Clara, CA (US)

(72) Inventors: Kalyan Kavalipurapu, Santa Clara, CA (US); Michele Piccardi, Santa Clara, CA (US); Jaekwan Park, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/423,916

(22) Filed: May 28, 2019

(51) Int. Cl.
| | |
|---|---|
| *G11C 8/08* | (2006.01) |
| *G11C 5/02* | (2006.01) |
| *G11C 5/14* | (2006.01) |
| *G11C 7/06* | (2006.01) |
| *G11C 7/12* | (2006.01) |
| *G11C 11/4076* | (2006.01) |

(52) U.S. Cl.
CPC .............. *G11C 8/08* (2013.01); *G11C 5/025* (2013.01); *G11C 5/147* (2013.01); *G11C 7/06* (2013.01); *G11C 7/12* (2013.01); *G11C 11/4076* (2013.01)

(58) Field of Classification Search
CPC ........... G11C 8/08; G11C 5/025; G11C 5/147; G11C 7/06; G11C 7/12; G11C 11/4076
See application file for complete search history.

(56) References Cited

U.S. PATENT DOCUMENTS

| | | | | |
|---|---|---|---|---|
| 8,432,739 B2 * | 4/2013 | Park | ........................ | G11C 16/30 365/185.13 |
| 8,867,299 B2 * | 10/2014 | Ryu | ........................ | G11C 8/14 365/230.03 |
| 8,982,641 B2 * | 3/2015 | Lu | ........................... | G11C 16/16 365/185.11 |
| 9,293,181 B2 * | 3/2016 | Koo | ........................ | G11C 8/12 |
| 9,715,934 B2 * | 7/2017 | Lee | ...................... | G11C 11/5635 |
| 2013/0088284 A1 * | 4/2013 | Jeong | ........................ | G11C 8/08 327/537 |

* cited by examiner

*Primary Examiner* — Tri M Hoang
(74) *Attorney, Agent, or Firm* — Compass IP Law PC

(57) ABSTRACT

A memory device includes a conductive line coupled to access addressable storage locations of the memory device. The memory device includes a circuit with a line driver with an access device for the conductive line. A control circuit sets a gate of the access device to an initial overdrive bias voltage to drive a drain of the access device to an initial voltage while the access device control circuit is not connected to the conductive line via another conductive line. The control circuit floats the gate voltage of the access device and connects the control circuit to the conductive line via the other conductive line. The floating initial overdrive voltage does not drop when the initial voltage of the control circuit drops to a final voltage under load conditions. The overdrive can result in a steeper program slope, and a controllable program pulse width or programming time ($t_{PROG}$).

21 Claims, 9 Drawing Sheets

FLOATING BLOCK SELECT BASED PROGRAMMING TIME (TPROG)

FIELD

Descriptions are generally related to storage devices, and more particular descriptions relate to adjustment of programming time based on control of select device bias.

BACKGROUND

The programming time (tPROG) of a nonvolatile memory device is a function of the wordline RC (resistance-capacitance) property. As storage devices increase in capacity with similar or smaller footprints, the density of storage cells increases. If the increasing density affects the RC properties of the storage devices, it can cause tPROG to increase non-linearly. Increasing tPROG results in poorer write performance. The program time includes the time for a series of pulses used to set the storage cells to their write state. Devices with increasing densities tend to have wider pulse widths, which extends the tPROG.

While a program pulse is typically represented as a square pulse, the reality of a program pulse is that it has a ramp up slope. The idealized square pulse represents an average time the pulse is applied. Operations to provide a steeper slope can increase the high voltage stress on the switching devices, which reduces the reliability of the device because it is subject to voltage differential stress between the gate and the drain.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Figure 1:
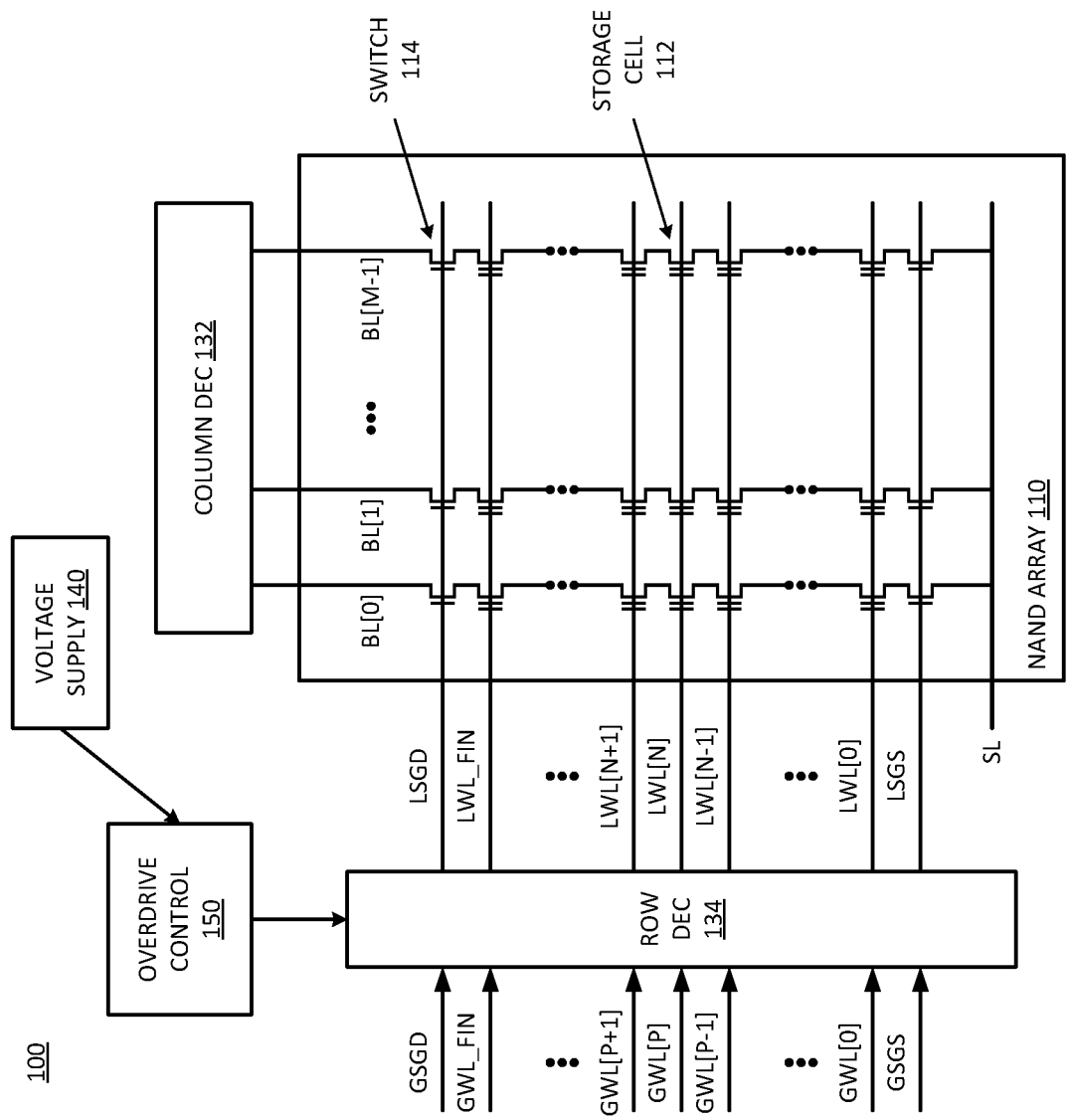
FIG. 1 is a block diagram of an example of a memory array with a decoder that has selective overdrive bias control.

Descriptions of certain details and implementations follow, including non-limiting descriptions of the figures, which may depict some or all examples, and well as other potential implementations.

DETAILED DESCRIPTION

As described herein, a memory device includes a conductive line coupled to access addressable storage locations of the memory device. The memory device includes a circuit with a line driver with an access device for the conductive line. A control circuit sets a gate of the access device to an initial overdrive bias voltage to drive a drain of the access device to an initial voltage while the control circuit is not connected to the conductive line and float the gate voltage at a higher overdrive voltage. The overdrive bias voltage can result in a steeper program pulse slope, while floating the gate voltage at the higher overdrive voltage can enable application of the higher overdrive voltage or desired final voltage for a shorter period of time. The bias voltage is floated by selectively connecting the conductive line with the control circuit, generating the bias voltage in an unloaded condition.

The control circuit generates a signal to cause the access device to selectively connect the conductive line to the control circuit via another conductive line. The initial overdrive bias voltage drops to a final overdrive voltage under load conditions when the access device selectively connects the conductive line to the control circuit via the other conductive line. For example, the conductive line can be a conductive line that connects to multiple storage locations of a memory block or string, and the other conductive line can be a conductive line that connects multiple blocks together. The access device can be a driver for the string or block. Floating the access device at an overdrive voltage and then loading the access device by connecting the conductive line to the control circuit via the other conductive line through the access device can result in a final desired program voltage. The voltage setting in the control circuit is set to the final desired program voltage just before the load application so the control circuit output drops and recovers to the final desired program voltage. The initial voltage setting is typically set higher than the final desired program voltage to generate the higher overdrive voltage. The overdrive as described can result in a steeper program slope, and a controllable program pulse width or programming time (tPROG or $t_{PROG}$).

In one example, the system utilizes a floating block select at an adjustable high voltage to reduce the program pulse width or improve programming slope. The adjustable overdrive voltage can improve tPROG by overcoming access device or string driver transistor resistance. The adjustable overdrive voltage provides better performance without significant increase in the area of the memory circuit. Additionally, the adjustable overdrive voltage can provide an increased current through the access device, based on the increased voltage differential with a higher overdrive bias voltage.

In one example, the control provides a program pulse based on a higher overdrive bias voltage relative to a comparable programming slope as regular overdrive, which in turn allows reduction of the pulse width. In one example, the control provides a program pulse based on a higher overdrive bias voltage relative to regular overdrive or standard driving, and the program slope improves when the same pulse width is retained (provided the given pulse width with regular overdrive bias is not high enough for steady state). This in turn translates to reduced number of pulses when compared to the regular overdrive case.

The application of the overdrive voltage as described herein can be thought of as having a preconditioning stage prior to the connection of the conductive line to the control circuit through the other conductive line via the access device. In one example, for each pulse in a program sequence, the system performs preconditioning to float the bias voltage to a higher overdrive, and then generates the program pulse with each pulse in the sequence having a pulse width that is narrower or has a shorter pulse time compared to a traditional pulse. In one example, for each pulse in a program sequence, the system performs preconditioning to float the bias voltage to a higher overdrive, and then generates the program pulse with each pulse in the sequence having the same pulse width compared to a traditional pulse, but the programming is accomplished with fewer pulses. In both cases the program time is improved. The shorter program time results in less overall time that the access device or switching transistor is exposed to the high voltage stress, even though for an individual pulse the voltage stress may be higher relative to a traditional pulse.

Consider three parameters for the program operation: tPROG, overdrive trimmability or trim control, and RWB (read window budget) post programming. As described above, the higher overdrive applied after preconditioning of the access device results in an improved (or lower) tPROG. The trimmability of the overdrive as described is controlled by low voltage logic rather than trimming in the high voltage domain using high voltage switches which is a die area intensive approach. The RWB is not impacted by the preconditioning even though there is improvement in tPROG and trim control. Memory devices having lower array resistance (R) or higher string driver or access device resistance are anticipated to see higher benefits in these areas relative to device with lower R.

Trim control or trimmability can refer to the ability to provide a trim to adjust a voltage parameter of the access device. A trim refers to a preconfigured or preset adjustment or offset applied to the target voltage. The trim for the circuit described is applied from a circuit that is set with a value that is converted into a voltage, such as setting a voltage level with a fuse or with a digital code. The digital value can be converted with a DAC (digital to analog converter). In a traditional system trimmability is achieved in the high voltage domain using high voltage switches, which occupy larger area. Having the trim in the high voltage domain refers to having the trim circuitry subject to the high voltage stress. The use of digital preconditioning allows removing the trim circuitry from the high voltage domain. Rather, the trim circuitry can be applied to set the bias voltage in the unloaded condition for the control circuit and applied to the access device, which is then floated and maintained to improve the program pulse operation. If the trim circuitry applies to the bias in the unloaded condition, fewer transistors are subject to the high voltage stresses as the higher overdrive bias is only applied to the row decoders and not to the circuits in other areas. Floating the bias can occur by trapping the charge necessary to complete the program operation.

FIG. 1 is a block diagram of an example of a memory array with a decoder that has selective overdrive bias control. System 100 represents a memory array with a decoder that has overdrive bias control according to any description herein. System 100 can be or be included in a 3D crosspoint (3DXP) array such as a byte addressable nonvolatile storage, a volatile memory array, a solid state drive (SSD), or other memory or storage that uses decoders to access crosspoint bitcells. System 100 can be integrated into a computing device.

System 100 includes memory array 110. In one example, memory array 110 represents a 3D NAND storage device. In one example, memory array 110 represents a 3D stacked memory device. In one example, the storage cells 112 represent NAND storage cells. In one example, storage cells 112 represent NOR-based storage cells. Storage cells 112 represent addressable storage locations within system 100.

In general, examples of memory cells can be part of a memory array for a dynamic random access memory (DRAM) device, a not AND (NAND) memory device, a not OR (NOR) memory device, a byte addressable nonvolatile memory such as a device made from chalcogenide material, a resistive memory where bitcells store data based on a resistive state of the memory cell, or other memory device. The memory array can be part of system memory, device storage, or other use of memory.

In one example, memory array 110 is segmented into addressable units of storage cells 112 based on global wordlines (GWL) and local wordlines (LWL). As illustrated, memory array 110 includes global wordlines identified as GWL[0], GWL[P−1], GWL[P], GWL[P+1], GWL[FIN], where GWL[FIN] refers to the final or highest address global wordline. Row decoder 132 can connect the global wordline to the local wordlines, where the local wordlines are identified as LWL[0], LWL[N−1], LWL[N], LWL[N+1], LWL{FIN}. In one example, there is a direct mapping between the global wordlines and the local wordlines. In one example, the numbers of global lines and local lines are different. Thus, N and P can be different numbers. In one example, memory array 110 includes global bitlines and local bitlines. To keep the diagram for system 100 simpler, global bitlines are not illustrated. Memory array 110 specifically illustrates bitlines BL[0] to BL[M−1]. M can be a different value than either N or P.

In one example, memory array 110 is segmented into subblocks. Segmentation of the memory array into different subblocks can include segmenting into any number of subblocks, and subblocks are not specifically shown. The segmentation into subblocks can alternatively be identified as being segmented into blocks or groups. An erase block refers to a portion of memory array 110 that is selected for erase. The erase block size is typically controlled by a host operating system, being a smallest unit size for access and programming. An erase block can include multiple subblocks.

In one example, a subblock refers to the columns, pillars, or strings of storage cells 112 that are accessed together. The pillars can be accessed to together by responding to a common switching signal. The switching signal can refer to gating control for the pillar. For example, the various pillars can be controlled by select gate drain (SGD) signal lines and select gate source (SGS) signal lines. In one example, memory array 110 includes local SGD (LSGD) and local SGS (LSGS). System 100 can also include global SGD (GSGD) and global SGS (GSGS). An SGD signal line selectively couples a column to a bitline (BL). An SGS signal line selectively couples a column to a source line (SL), which can be a source layer of material integrated onto a semiconductor substrate.

In one example, row decoder 134 maps GSGS to LSGS and GSGD to LSGD of memory array 110. In a system with subblocks, the mapping of the global to the local select gates can be specific for a subblock.

System 100 includes column decode circuitry (column dec) 132 as a column address decoder to determine from a received command which bitline or bitlines to assert for a particular command. Row decode circuitry (row dec) 134 represents a row address decoder to determine from a received command which wordline or wordlines to assert for the command. It will be understood that column decoder 132 and row decoder 134 can represent many separately controllable switching devices. For example, each BL can include a separate decoder circuit to control access to the bitline. Similarly, each WL can include a separate decoder circuit to control access to the wordline. In one example, row decoder 134 provides connection between the global lines and the local lines.

The decoders can represent decoder or access device circuitry for global conductive lines as well as for local conductive lines. In general, a memory decoder enables the selection of a conductor of a row or column or pillar of a crosspoint array memory. The decoder includes a circuit to apply a bias voltage to select or deselect the conductor or conductive line. The conductor can be either a wordline or a bitline or a channel. A wordline refers to a wordline conductor that is charged in response to a wordline address or row address and is often considered the x-axis conductor. A bitline refers to a bitline conductor that is charged in response to a bitline address or column address. A channel refers to a channel conductor for three-dimensional (3D) memory arrays. In a 3D structure, the architecture of wordline and bitline may be different than in a traditional planar memory structure. A channel can be referred to as a pillar and may be charged by a decoder in response to a bitline address, for example, by the decoder charging the bitline which connects to the pillar. Thus, a crosspoint array can refer to an array of overlapping and crisscrossing conductive lines to charge or bias memory cells.

In one example, the overdrive described herein applies to decoder or select circuitry that couples global conductive lines to local conductive lines. It will be understood that the overdrive could be applied to other select devices and not just at the interconnection between global and local conductive lines. In one example, the overdrive as described is applied to a string driver transistor that provides an improved LWL ramp. The decoder circuitry can be considered control circuitry to bias the select devices or control circuitry to control the bias of the select devices. Based on the bias applied to the select devices and the selective switching to connect conductive lines together, read and write access is controlled for storage cells 112 of memory array 110.

The decoder circuits 132 and 134 selectively couple voltage supply levels from one or more voltage supply devices 140 of system 100. Voltage supply 140 represents one or more voltage sources or voltage levels generated to power electronic components of system 100. In one example, system 100 includes overdrive control 150. Overdrive control 150 is specifically illustrated as being able to control row decoder 134. In one example, row decoder 134 includes decoder circuitry to couple global wordlines to local wordlines. Overdrive control 150 can provide a higher overdrive voltage by preconditioning the access device gate, raising the bias voltage to a high overdrive voltage when the control circuit is unloaded. The unloaded condition can refer to a condition where the overdrive control circuit is not connected to any load, such as a wordline load. In the unloaded condition of the control circuit, the gate of the access device is floated at the higher overdrive voltage generated by the control circuit. When the control circuit is connected to the load or conductive line, the system can maintain the overdrive bias voltage for the access devices to provide improved slew rate for the device. As such, the device can conduct in the active region for more of the pulse width, resulting in more efficient energy transfer to the target conductive line. The more efficient transfer can in turn improve the program performance of the conductive line due to faster settling of the conductive line.

In one example, row decoder 134 or column decoder 132, or both column decoder 132 and row decoder 134, include or represent line drivers for conductive lines. The line drivers are driver circuits that apply a voltage to a conductive line, enabling access to a device based on a crosspoint activation (e.g., the storage cell is accessed where a WL and a BL intersect). The decoder circuitry operates in response to control circuitry (not specifically shown) such as a controller or control logic. The controller applies signals to cause the decoders to operate to enable access to selected, addressed storage cells. In one example, the decoder includes an access device that receives an initial overdrive bias voltage at a gate of the access device. The overdrive bias can be trapped onto the gate of the access device by floating it after passing the overdrive bias in an unloaded condition of the control circuit while the access device is not connected to the control circuit, or when the access device does not connect the conductive line to the control circuit via the other conductive line. In response to a signal to connect the conductive line via the access device to the control circuit through the other conductive line, the control circuit transitions from an unloaded condition to loaded condition. In one example, the access device overdrive bias is maintained on the gate, and the control circuit voltage drops from the initial higher voltage (Vpgm_reg_ini) to the final desired voltage (Vpgm_reg_fin). The increased voltage potential can improve the shape of the pulse.

In one example, system 100 includes or is part of a system that includes a storage controller (not specifically shown). The storage controller refers to a device or circuit that controls access to the memory array. In one example, the storage controller refers to a controller, such as a media controller, on a memory chip or a media controller in a storage drive. In one example, the storage controller is part of the memory or storage subsystem that includes memory array 110. The storage controller can provide one or more control signals to cause a conductive line to access addressable storage locations of memory array 110. The storage controller can cause access devices for memory array 110 to receive an initial overdrive bias voltage, receive a signal to connect the access device to the conductive line, and maintain the overdrive bias after connecting the access device.

Figure 2:
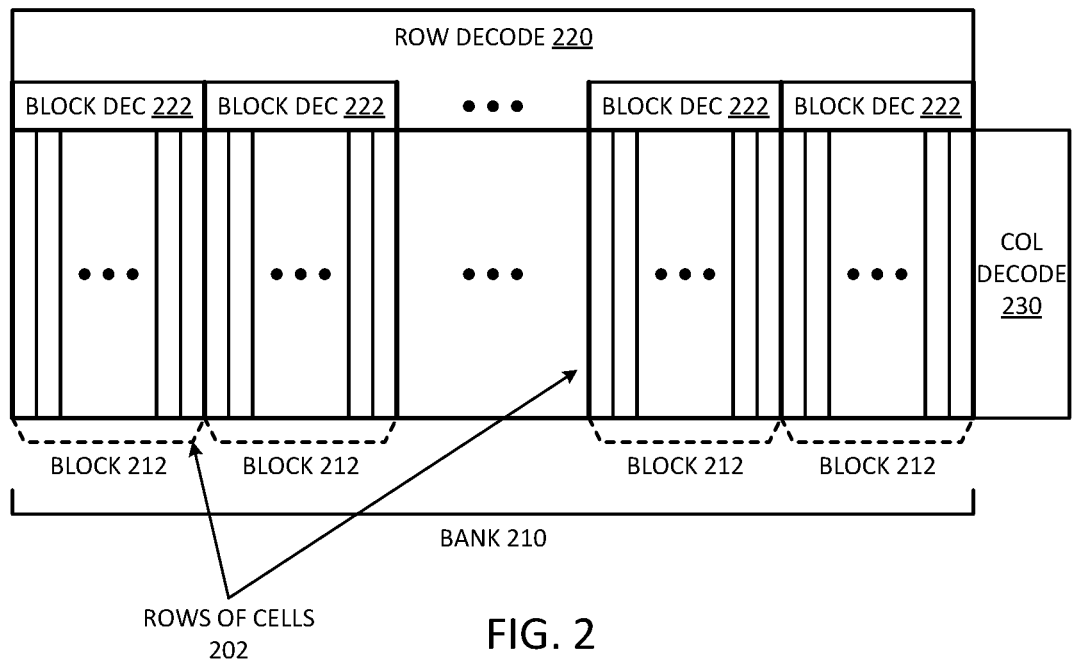
FIG. 2 is a block diagram of an example of a memory architecture subdivided into array blocks with a decoder that has overdrive bias control.

FIG. 2 is a block diagram of an example of a memory architecture subdivided into array blocks with a decoder that has overdrive bias control. Memory 200 illustrates components of a memory device with a specific mapping of I/O (input/output) to portions of the memory array, which can be a memory array in accordance with system 100. In one example, memory 200 represents memory elements that are part of a solid state drive (SSD) that stores data in nonvolatile bitcells. Memory 200 selectively connects the I/O to specific cells with decoder circuitry that can be in accordance with any example of a decoder herein. The decoder circuitry enables access to specific cells.

Memory 200 includes bank 210, which includes multiple rows of cells 202. The vertical rectangles of the diagram represent the rows. In one example, bank 210 is organized as multiple blocks 212. It will be understood that the expression "bank" is used as an example, and other terminology could be used for a memory device or storage device. Block 212 can refer to a group of rows 202. An access command (either a Read command or a Write command) triggers command signal lines that are interpreted by row decode logic 220 to select a row or rows for the operation. In one example, row decode logic 220 includes block decode logic 222 to select a specific block 212 of bank 210. Block decode logic 222 can represent another level of decoding logic, which can be in addition to row decode 220 or can simply be a specific type of row decode 220. Memory 200 includes column decode logic 230 to select a column of data, where signal lines from specific blocks or subarrays can be output to sense amplifiers and routed to I/O (not specifically shown).

The I/O can include local I/O and global I/O. Local I/O can refer to the routing circuitry to transfer data of specific blocks 212. Global I/O can refer to the routing circuitry that couples the local I/O to the external I/O connectors of memory 200. In one example, decoders of row decode 220 or block decode 222 or both apply overdrive voltage to bias select devices. The overdrive can be applied in a preconditioning phase, followed by floating the gate and connecting the target conductive lines. When the conductive line is connected, the system can provide higher currents in the access device, which lowers the perceived resistance of the access device.

In one example, block decode 222 is or includes a block driver. The block driver can be an access device controlled with overdrive bias. The system can repeatedly provide the overdrive voltage bias to an access device over multiple pulses of a program sequence. The sequence or series of program pulses are provided to program storage locations of a block 212. The preconditioning and floating of the decoder access device enable a higher current implementation that can result in improvements to the program pulse shape, providing improved program time. The program time can be improved over a sequence of program pulses.

Figure 3:
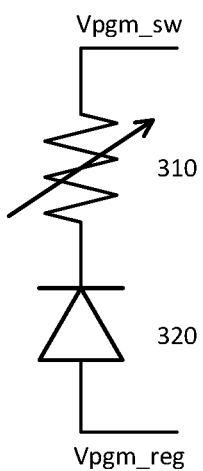
FIG. 3 is a circuit diagram of an example of programmable bias control.

FIG. 3 is a circuit diagram of an example of programmable bias control. Circuit 300 represents a general circuit representation of overdrive generation. Circuit 300 illustrates the general form of an overdrive circuit with diode 320 and variable resistance 310.

The anode of diode 320 is coupled to voltage level Vpgm_reg, referring to a program voltage for the cell or wordline. The cathode of diode 320 is coupled to variable resistance 310. Variable resistance 310 represents circuitry to variably adjust the offset from Vpgm_reg to Vpgm_sw, or the voltage to pass Vpgm_reg through access switches. The regulator refers to the source of the bias voltage, and the switch voltage refers to the bias voltage applied to the gate of the switch used to connect one conductive line to another, such as a global line to a local line. In one example, the $\Delta V\_overdrive = Vpgm\_sw - Vpgm\_reg$.

An adjustable or higher overdrive (delta_v or $\Delta V$) is traditionally generated by adding diode drop or voltage difference by a current through a resistor (e.g., IR drop in variable resistor 310) change from the Vpgm regulator. In the traditional generation, varying $\Delta V$ on a pulse to pulse basis requires applying a voltage trim to adjust the variable resistance in the high voltage domain. Applying voltage trim in the high voltage domain impacts area of the circuitry, and the trimming circuitry is larger in area and under much higher voltage stress as compared to a method operating under lower voltages.

In one example, $\Delta V$ generated under no load condition is applied as a bias voltage and retained throughout the program pulse. The program pulse will be applied under full load condition. The higher bias voltage is anticipated to increase the current through the switching transistor. In one example, all transistors connected to Vpgm_sw are stressed at the high voltage for a longer duration.

Figures 4A, 4B:
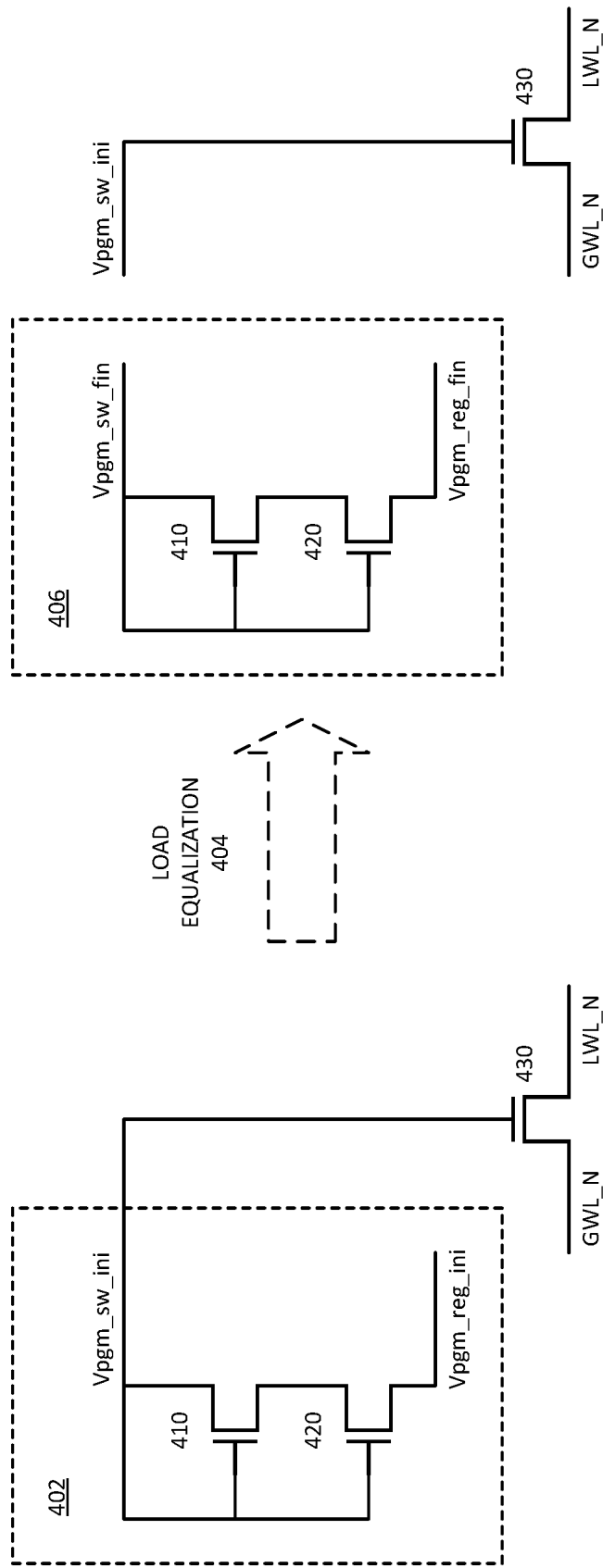
FIG. 4A-4B represent a circuit diagram of an example of selective overdrive bias.

FIG. 4A-4B represent a circuit diagram of an example of selective overdrive bias. Circuit 402 of FIG. 4A illustrates an example of circuit 300 of FIG. 3 to provide an access device bias. In one example, the access device is a string driver. The string driver can include a transistor or a circuit to connect a global line to multiple local lines. As such, the string driver controls access to a string of storage cells.

Circuit 402 illustrates a preconditioning phase before the driver is loaded by connection to the local lines. When the driver turns on it can apply the global line voltage to the local lines. Circuit 402 illustrates an example of transistor 410 and transistor 420 coupled in series between Vpgm_sw_ini and Vpgm_reg_ini. Vpgm_sw_ini represents an initial program voltage for the switch bias and Vpgm_reg_ini represents an initial program voltage for the regulator that supplies the bias voltage. Transistors 410 and 420 are coupled in diode configuration with their gates connected to the drain of transistor 410, at Vpgm_sw_ini.

In one example, circuit 402 provides control of switch transistor 430. Switch transistor 430 controls the connection of GWL to the LWLs for a block of memory cells. Typically, a GWL couples to multiple LWLs. The number of local lines per global line will depend on the memory architecture, as well as what type of line it is (for example, there may be a different number of LBLs (local bitlines) associated with a GBL (global bitline) than there are LWLs associated with a GWL). Switch transistor 430 can be part of a decoder as described herein, to provide access to a portion of a memory array. When switch transistor is activated, current will flow through the device to apply the GWL voltage to the LWL.

In one example, the program voltage is very high, so switch transistor 430 will pass a very high voltage from the GWL to the LWL. Switch transistor 430 could be referred to as a block selector or a string driver. In one example, every global line has a switch transistor such as switch transistor 430 to couple the global line to the local lines. Switch transistor 430 can be considered a passgate to pass the voltage from the global line to the local line.

In one example, the voltage Vpgm_reg is generated from a voltage pump that ramps up the voltage to a programming voltage much higher than a read voltage. Vpgm_sw_ini is a higher voltage than a traditional Vpgm_sw for that pulse. The higher voltage on the gate provides a high Vgate to Vsource or Vgate to Vdrain, and gives higher current and lower resistance for the switch. In one example, the higher Vpgm_sw_ini is generated by regulating Vpgm_reg/blksel_hv/swvpx to a target higher voltage Vpgm_reg_ini. In one example, the blksel_hv/swvpx is floated at the higher Vpgm_sw_ini generated before load equalization, as illustrated in circuit 402.

In one example, circuit 402 can apply a trim to Vpgm_reg_ini (not specifically shown). In one example, the trim can be changed to a target value for a specific pulse, Vpgm_reg_fin, before load equalization. It will be understood that application of the trim can occur prior to load equalization 404 when the global and local lines are connected. If only transistors connected to blksel_hv/swvpx are stressed at the higher overdrive voltage, in one example, trim circuitry does not have to be able to withstand high voltages because it will not be in the high voltage path.

Load equalization 404 represents the connection of the global line to the local lines. Since Vpgm_reg_ini is generated under no load condition, it implies lower ICC (control circuit current) for the control circuit (e.g., circuit 402). ICC for the control circuit configured to generate higher overdrive under no load condition as shown in circuit 402 is expected to be lower than that the case if higher overdrive is generated under loaded condition. The source of transistor 420 is coupled to Vpgm_reg_ini in control circuit before load equalization, as illustrated in circuit 402. The corresponding Vpgm_sw (drain of transistor 410) is Vpgm_sw_ini. Prior to load equalization, the access device is floated and voltage setting in the control circuit is changed to Vpgm_reg_fin. Post recovery from load equalization, the control circuit is as shown in circuit 406. The source of transistor 420 is Vpgm_reg_fin and the drain of transistor 410 is Vpgm_sw_fin. As shown in circuit 406, the control circuit is not connected to switch transistor 430, and the gate of switch transistor 430 is floated at Vpgm_sw_ini, which is higher than Vpgm_sw_fin. Thus, in one example, after load equalization, switch transistor 430 will see a higher overdrive given by Vpgm_sw_ini minus Vpgm_reg_fin. The current through switch transistor 430 is ICC, which is higher than the scenario where Vpgm_sw_fin is at the gate of transistor 430 and Vpgm_reg_fin is at the source.

In one example, the system varies delta_v on a pulse to pulse basis by changing Vpgm_reg_ini through firmware control. The change in the firmware control does not result in any area impact on the circuitry, because the trim can be applied to boost the voltage without having to change the circuitry. It will be understood that the voltage applied to the gate of switch transistor 430 is variable, and can be changed to a higher overdrive bias as described. In one example, the bias is changed from one pulse to the next in a train or sequence of pulses used to program the memory cells.

Figure 5:
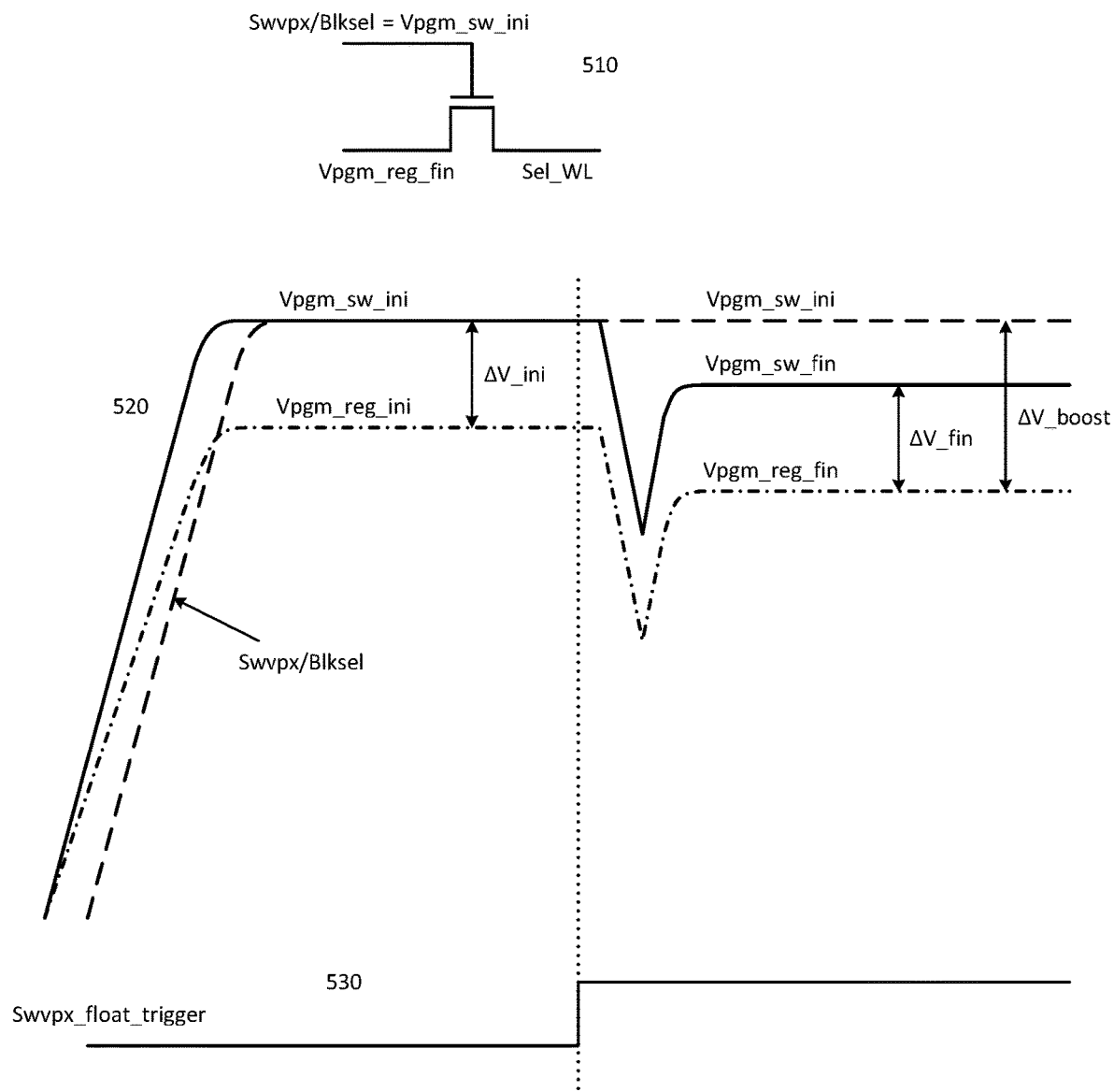
FIG. 5 is a diagram of an example of a curve illustrating aspects of overdrive generation.

FIG. 5 is a diagram of an example of a curve illustrating aspects of overdrive generation. Diagram 520 illustrates the operation of switch transistor 510. Signal 530 illustrates a trigger signal used to change the overdrive as compared to a traditional overdrive scenario.

Switch transistor is illustrated as being having its gate connected to a signal line Swvpx/Blksel, which represents a switch control signal or block select signal. In one example, the signal line Swvpx/Blksel is floated at the higher Vpgm_sw_ini as seen in diagram 520 with the dashed line.

The solid line represents an overdrive, where Vpgm_sw can be first raised to Vpgm_sw_ini, and before loading be applied at Vpgm_sw_fin. The dash-dotted line illustrates the regulator voltage. In one example, during an initial phase in which preconditioning occurs, the gate of switch transistor 510 is connected to Vpgm_sw_ini, and the source of switch transistor 510 is initially not connected to a program voltage. The change from the initial voltage to the final voltage for the regulator is triggered by the trigger signal swvpx_float_trigger which enables the connection of load to the regulator or control circuit or source of a transistor (e.g., transistor 420 of FIG. 4A and FIG. 4B). The transition is illustrated by the drop in the curves as the current begins to flow. The regulator changes to the final voltage when the local wordline (or selected WL (Sel_WL)) is coupled to the drain, as illustrated for the final condition. In one example, the gate of switch transistor 510 remains at Vpgm_sw_ini.

Referring again to diagram 520, the dash-dotted line illustrates a rise of the regulator voltage to Vpgm_reg_ini, which goes down to Vpgm_reg_fin in loaded condition. The solid line represents the traditional switch response curve, which rises to Vpgm_sw_ini and then drops to Vpgm_sw_fin. As illustrated, the gate voltage is floated to Vpgm_sw_ini for the entire pulse. Thus, the dashed line illustrates rising to Vpgm_sw_ini, which continues even after loading.

Signal 530 illustrates the control to cause the gate voltage of the switching transistor to be floated high at Vpgm_sw_ini. In one example, in response to the trigger (shown by the rising edge), the control circuitry maintains Vpgm_sw_ini on the gate of the access device instead of lowering the voltage. Traditionally, Swvpx/Blksel follows Vpgm_sw. But diagram 520 illustrates that Swvpx/Blksel is set to Vpgm_sw_ini, and then floated to stop following Vpgm_sw. Such an operation results in a higher overdrive differential.

Diagram 520 illustrates $\Delta V = Vpgm\_sw - Vpgm\_reg$. Thus, $\Delta V\_ini = Vpgm\_sw\_ini - Vpgm\_reg\_ini$ and $\Delta V\_fin = Vpgm\_sw\_fin - Vpgm\_reg\_fin$. Diagram 520 also illustrates that Vpgm_sw_ini is higher than Vpgm_sw_fin and Vpgm_reg_ini is higher than Vpgm_reg_fin. When Swvpx/Blksel is floated at Vpgm_sw_ini instead of being lowered to Vpgm_sw_fin, the resulting delta is $\Delta V\_boost = Vpgm\_sw\_ini - Vpgm\_reg\_fin$, which is higher than $\Delta V\_fin$.

The operation prior to the float trigger can be referred to as a conditioning phase, where Swvpx/Blksel is raised to Vpgm_sw_ini and so the gate of switch transistor 510 is raised to the initial overdrive voltage. In one example, the trigger is a digital control signal that occurs approximately concurrently with the triggering of the load for the regulator. The floating phase can follow the conditioning or preconditioning phase to maintain the gate voltage. In one example, the voltage is floated by trapping charge on the gate necessary to maintain the higher voltage to complete the program pulse operation.

Consider an example where Vpgm_reg=18V. Perhaps a normal program condition would result in Vpgm_sw=22V, and an overdrive program condition would have Vpgm_sw_ini=24V. The overdrive could alternatively be 25V, 26V, 27V, or some other voltage. The voltage can be higher than a traditional pulse, and the specific overdrive capability will depend on the architecture of the device. A traditional overdrive might only be 22V, for example, resulting in a Vgs (or $\Delta V$) of 4V, whereas the overdrive described herein could be higher, such as 7V. The higher Vgs will result in a steeper program pulse.

Figure 6:
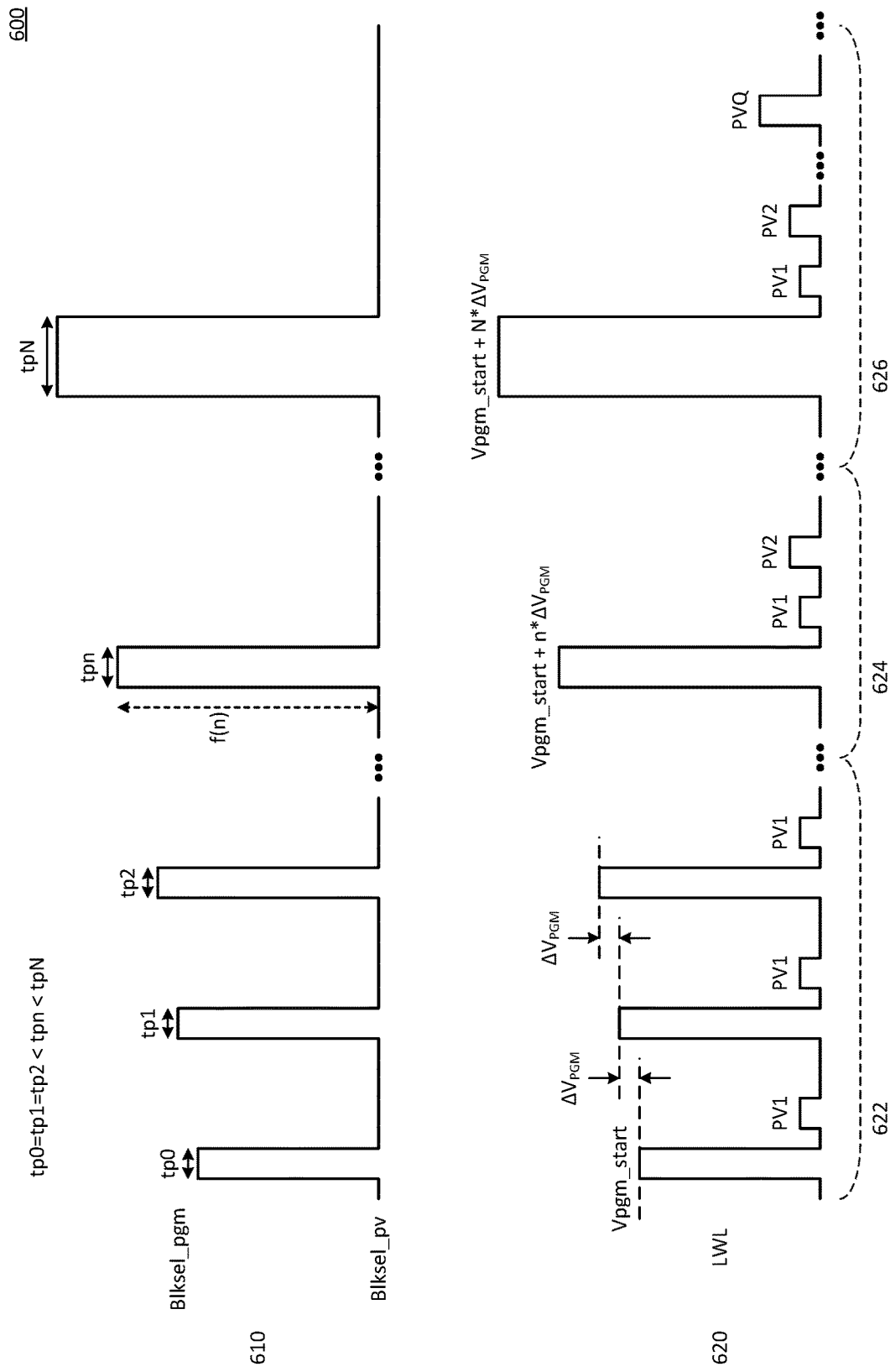
FIG. 6 is a diagram of an example of a pulse sequence with overdrive bias with pulses having a width less than a pulse sequence that does not have overdrive bias.
Figure 7:
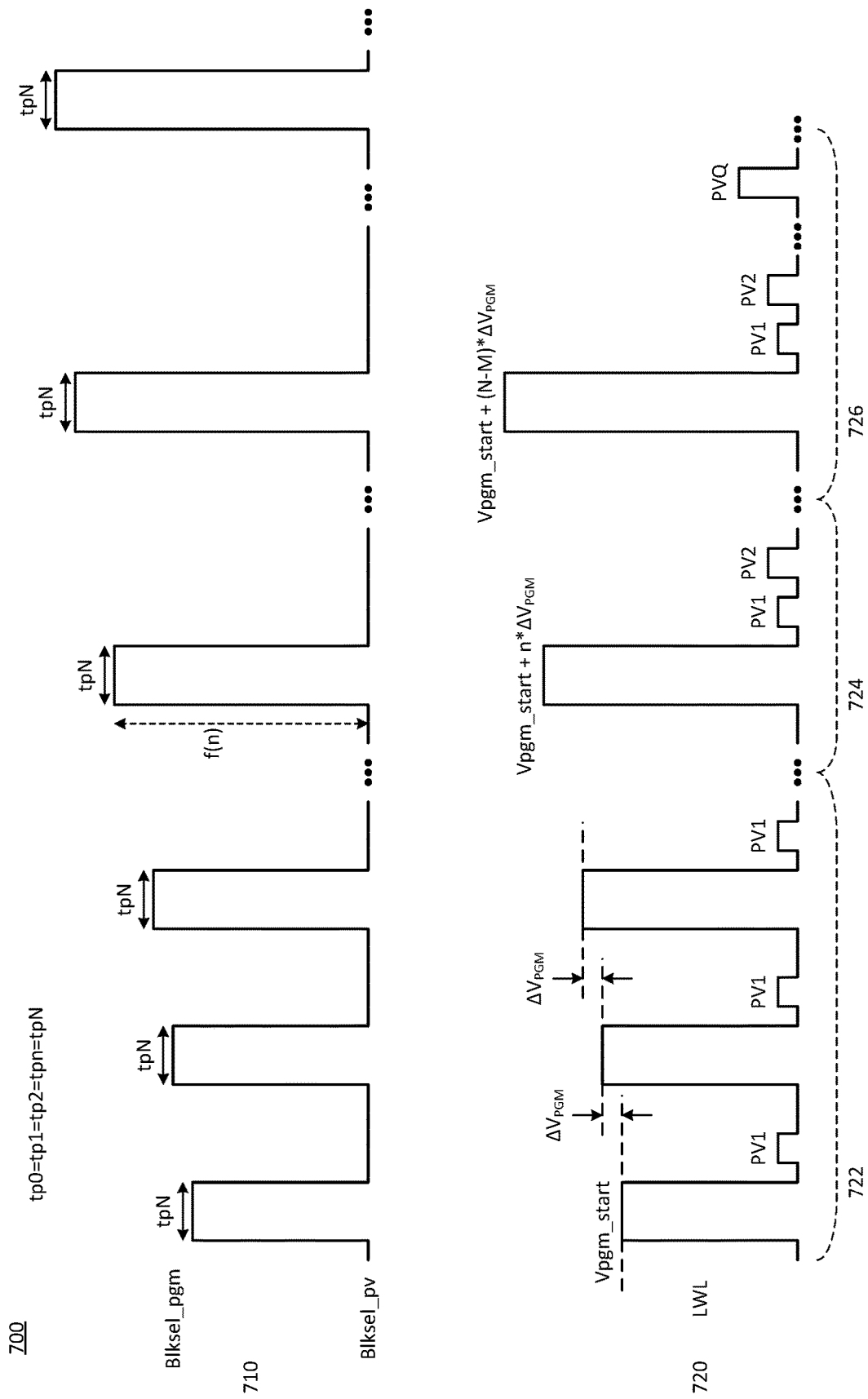
FIG. 7 is a diagram of an example of a pulse sequence for pulses having a width equal to a pulse sequence that does not have an overdrive bias but has fewer pulses in the sequence.

The steeper program pulse can allow for fewer pulses in the program sequence by maintaining the same pulse width, or allow for shorter (narrower) pulse widths. The time tPROG refers to a total program time, and includes the time for a train or a sequence of program pulses. In one example, as illustrated in FIG. 6, tPROG improvement is achieved by providing higher overdrive while lowering pulse width when compared to a regular overdrive case. In one example, as illustrated in FIG. 7, tPROG improvement is achieved by providing higher overdrive while maintaining pulse width when compared to a regular overdrive case, but then using fewer pulses. In either case the program time will be improved. In both of the following diagrams there are features that are exaggerated to illustrate a point. The diagrams are for purposes of illustration only and are not limiting on the shape and proportions of the program pulse operation. The diagrams are not necessarily proportioned to scale, whether relative height of the pulses, the timing between pulses, or the pulse width.

FIG. 6 is a diagram of an example of a pulse sequence with overdrive bias with pulses having a width less than a pulse sequence that does not have an overdrive bias. Sequence 610 illustrates the general form of the program operation. In one example, the pulse width is varied from pulse to pulse. In one example, multiple pulses will have the same pulse width to program the same level for a multilevel cell (MLC), and the pulse width can be increased for each subsequent programming level.

Sequence 610 illustrates the pulses made for Blksel_pv or the program voltage for the block select. The program voltage will include pulses that have a height of amplitude of Blksel_pgm or the program voltage level for the block select. Blksel_pgm=f(n), which indicates that the program pulse amplitude is a function of which pulse is currently in progress. The program pulse typically increases in amplitude as the pulse number increases.

As illustrated, tp0, tp1, and tp2 have the same pulse width. These pulses can be considered pulses to program the same voltage level. The pulse width of tpn is greater than tp0, and represents pulses that would be used to program a different voltage level than what tp0 would program. The last pulse tpN has the widest pulse width and the highest amplitude. Expressed another way, tp0=tp1=tp2<tpn<tpN. In one example, tpN has a pulse width equal to that of a traditional program pulse, which can be expressed as: tp0/tp1/tp2 . . . /tpn<tp. In one example, tpN has a pulse width greater than that of a traditional program pulse, and thus there is some pulse tpm that equals a traditional pulse width, which can be expressed as: tp0/tp1/tp2 . . . /tpm<tp<tp(m+1)/tpN. It will be understood that there can be multiple pulses having the same pulse width with different amplitude, depending on whether the voltage level verified properly after the program pulse. In one example, the pulse width is increased once the verify process indicates a successful programming.

In one example, whatever the amplitude, the bias can be set between bias voltage and trim to match the programming pulse slope to a regular overdrive case. Thus, in one example, the bias can be adjusted with trim to match a programming slope. In one example, the programming slope is steeper with the overdrive provided than a traditional overdrive case. In one example, the overdrive bias voltage can be varied from pulse to pulse to match programming slope from pulse to pulse. In one example, each pulse width of the program sequence is less than or shorter than the program pulse width of a traditional pulse, but the various pulses in the sequence do not need to have the same pulse width. In one example, the system can adjust the pulse width from pulse to pulse. In one example, the pulse width is adjusted via digital code, and an adjustment to the code from pulse to pulse can adjust the pulse width.

Sequence 620 illustrates an application of sequence 610 to a local wordline (LWL). Phase 622 represents the programming operations for the first level of a multilevel program operation. The first pulse can have an amplitude of Vpgm_start and each subsequent program pulse can have an increase of ΔVpgm, as is performed in a typical instance of programming a multilevel cell. In one example, after the program pulse the system performs a program verify, PV1, for the first voltage level.

When the first voltage level verifies properly, the programming sequence at phase 624 programs cells with the second level, and will thus provide a program pulse followed by program verify pulses PV1 and PV2. It will be understood that the pulse width of the program verify pulses is not necessarily controlled relative to the pulse width of the program pulse. The height of the pulse shown in phase 624 is Vpgm_start+n*ΔVpgm, where n is the number of the pulse.

After the second voltage level passes verification, and after all other Q−1 voltage levels pass verification, the last pulse, pulse N, is provided and verified, as shown in phase 626. It will be understood that N is not necessarily a fixed number because the number of pulses performed will depend on how many pulses are needed to properly set each voltage level with proper verification. Even though the pulse widths are shorter than the standard program pulse, N should be the same for sequence 620 as for a standard program sequence. But with narrower program pulses, the overall program time can be improved.

FIG. 7 is a diagram of an example of a pulse sequence for pulses having a width equal to a pulse sequence that does not have an overdrive bias but has fewer pulses in the sequence. Sequence 710 illustrates the general form of the program operation. In one example, the pulse width is the same from pulse to pulse. Sequence 710 illustrates the pulses made for Blksel_pv or the program voltage for the block select. The program voltage will include pulses that have a height of amplitude of Blksel_pgm or the program voltage level for the block select. Blksel_pgm=f(n), which indicates that the program pulse amplitude is a function of which pulse is currently in progress. The program pulse typically increases in amplitude as the pulse number increases, even if the program pulse width remains the same.

As illustrated, all program pulses have the same pulse width. Expressed another way, tp0=tp1=tp2=tpn=tpN. In one example, tpN has a pulse width equal to that of a traditional program pulse. In one example, whatever the amplitude, the bias can be set between bias voltage and trim to match the programming pulse slope to a regular overdrive case. Thus, in one example, the bias can be adjusted with trim to match a programming slope. In one example, the programming slope is steeper with the overdrive provided than a traditional overdrive case. In one example, the overdrive bias voltage can be varied from pulse to pulse to match programming slope from pulse to pulse. In one example, each pulse width of the program sequence is the same, but the conditioning phase unloaded bias voltage can provide the voltage necessary to result in a common pulse slope.

Sequence 720 illustrates an application of sequence 710 to a local wordline (LWL). Phase 722 represents the programming operations for the first level of a multilevel program operation. The first pulse can have an amplitude of Vpgm_start and each subsequent program pulse can have an increase of ΔVpgm, as is performed in a typical instance of programming a multilevel cell. In one example, after the program pulse the system performs a program verify, PV1, for the first voltage level.

When the first voltage level verifies properly, the programming sequence at phase 724 programs cells with the second level, and will thus provide a program pulse followed by program verify pulses PV1 and PV2. It will be understood that the pulse width of the program verify pulses is not necessarily controlled relative to the pulse width of the program pulse. The height of the pulse shown in phase 724 is Vpgm_start+n*ΔVpgm, where n is the number of the pulse.

After the second voltage level passes verification, and after all other Q−1 voltage levels pass verification, the last pulse, pulse (N−M), is provided and verified, as shown in phase 726. It will be understood that N and M are not necessarily fixed numbers because the number of pulses performed will depend on how many pulses are needed to properly set each voltage level with proper verification. In the example of sequence 720, only N–M pulses are needed to program the cells as opposed to N pulses needed with traditional pulses.

In one example, even though the pulse widths have the same width as the standard program pulse, sequence 720 can perform the programming with M fewer pulses because the pulses have improved slope and provide improved current in the switch transistor or access transistor. With improved current, the cells are more likely to be programmed due to faster settling than with traditional program pulses. Thus, the programming is expected to be accomplished in fewer pulses relative to the N pulses of a traditional sequence. Although the pulse widths are the same, the use of fewer program pulses will improve the overall program time.

Figure 8:
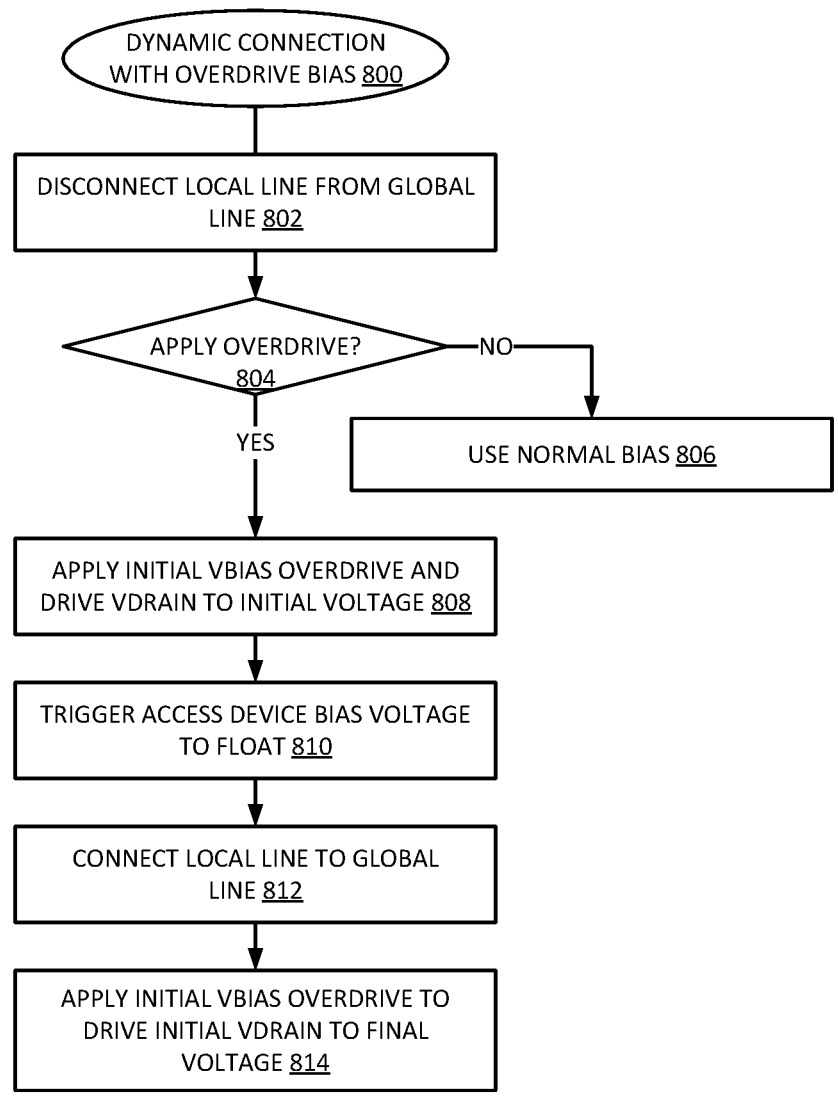
FIG. 8 is a flow diagram of an example of a process for selective application of an overdrive bias.

FIG. 8 is a flow diagram of an example of a process for selective application of an overdrive bias. Process 800 for dynamic connection with an overdrive bias can be applied by a line driver in accordance with any example provided herein.

In one example, the program pulse process starts when the local line is disconnected from the global line, at 802. If the driver will not apply overdrive to the pulse, at 804 NO branch, the system can apply a normal bias to the decoder access device, at 806.

In one example, if the driver will apply overdrive to the pulse, at 804 YES branch, the system can apply an initial bias voltage overdrive and drive Vdrain to an initial drain voltage, at 808. In one example, the system triggers the access device bias voltage to float at the initial bias voltage, which is higher than a typical overdrive bias would be, at 810.

With the bias voltage floating, the system can connect the local line to the global line, at 812. The initial bias voltage is applied to the access device when the driver is not loaded, and maintains the higher bias voltage when the device is operating as a passgate to pass the voltage of the global line to the local line. Thus, the system or regulator or driver can apply the initial overdrive bias voltage to drive the initial Vdrain to a final Vdrain voltage, at 814. It will be understood that process 800 repeats for each program pulse in the program sequence.

Figure 9:
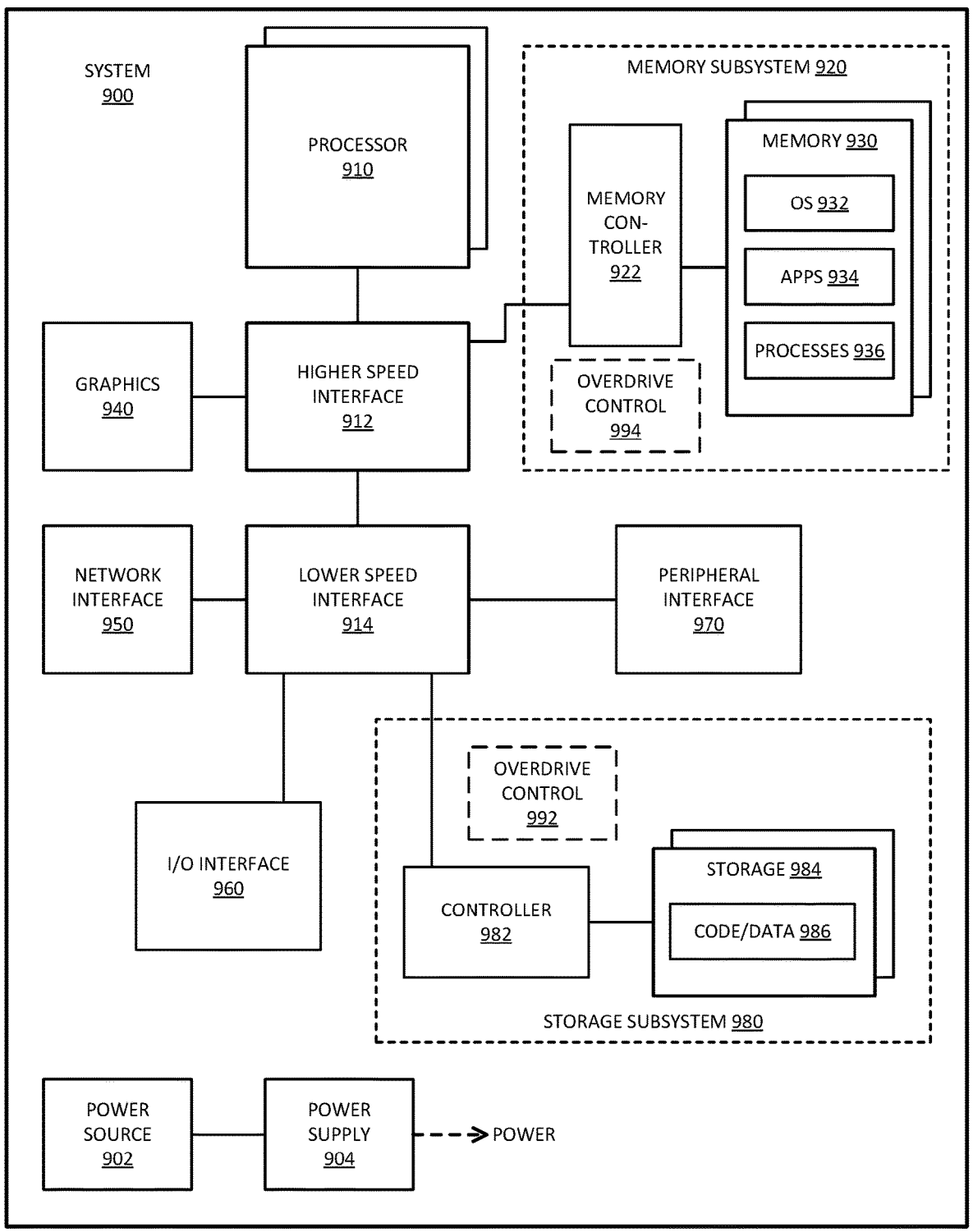
FIG. 9 is a block diagram of an example of a computing system in which a decoder with overdrive bias control can be implemented.

FIG. 9 is a block diagram of an example of a computing system in which a decoder with overdrive bias control can be implemented. System 900 represents a computing device in accordance with any example herein, and can be a laptop computer, a desktop computer, a tablet computer, a server, a gaming or entertainment control system, embedded computing device, or other electronic device.

In one example, system 900 includes overdrive control 992 in storage subsystem 980, or overdrive control 994 in memory subsystem 920. Typically, overdrive control as described herein is applied to a nonvolatile storage where a memory array is programmed by a sequence of program or write pulses. The overdrive control can perform overdrive in accordance with any example herein. The overdrive control applies a higher bias voltage, floats the bias voltage to the higher voltage while the access device is not loaded, and then loads the access device to connect the global line to the local lines to apply the program voltage to the bitcells of the memory array.

System 900 includes processor 910 can include any type of microprocessor, central processing unit (CPU), graphics processing unit (GPU), processing core, or other processing hardware, or a combination, to provide processing or execution of instructions for system 900. Processor 910 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 900 includes interface 912 coupled to processor 910, which can represent a higher speed interface or a high throughput interface for system components that need higher bandwidth connections, such as memory subsystem 920 or graphics interface components 940. Interface 912 represents an interface circuit, which can be a standalone component or integrated onto a processor die. Interface 912 can be integrated as a circuit onto the processor die or integrated as a component on a system on a chip. Where present, graphics interface 940 interfaces to graphics components for providing a visual display to a user of system 900. Graphics interface 940 can be a standalone component or integrated onto the processor die or system on a chip. In one example, graphics interface 940 can drive a high definition (HD) display that provides an output to a user. In one example, the display can include a touchscreen display. In one example, graphics interface 940 generates a display based on data stored in memory 930 or based on operations executed by processor 910 or both.

Memory subsystem 920 represents the main memory of system 900, and provides storage for code to be executed by processor 910, or data values to be used in executing a routine. Memory subsystem 920 can include one or more memory devices 930 such as read-only memory (ROM), flash memory, one or more varieties of random access memory (RAM) such as DRAM, or other memory devices, or a combination of such devices. Memory 930 stores and hosts, among other things, operating system (OS) 932 to provide a software platform for execution of instructions in system 900. Additionally, applications 934 can execute on the software platform of OS 932 from memory 930. Applications 934 represent programs that have their own operational logic to perform execution of one or more functions. Processes 936 represent agents or routines that provide auxiliary functions to OS 932 or one or more applications 934 or a combination. OS 932, applications 934, and processes 936 provide software logic to provide functions for system 900. In one example, memory subsystem 920 includes memory controller 922, which is a memory controller to generate and issue commands to memory 930. It will be understood that memory controller 922 could be a physical part of processor 910 or a physical part of interface 912. For example, memory controller 922 can be an integrated memory controller, integrated onto a circuit with processor 910, such as integrated onto the processor die or a system on a chip.

While not specifically illustrated, it will be understood that system 900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 900 includes interface 914, which can be coupled to interface 912. Interface 914 can be a lower speed interface than interface 912. In one example, interface 914 represents an interface circuit, which can include standalone components and integrated circuitry. In one example, multiple user interface components or peripheral components, or both, couple to interface 914. Network interface 950 provides system 900 the ability to communicate with remote devices (e.g., servers or other computing devices) over one or more networks. Network interface 950 can include an Ethernet adapter, wireless interconnection components, cellular network interconnection components, USB (universal serial bus), or other wired or wireless standards-based or proprietary interfaces. Network interface 950 can exchange data with a remote device, which can include sending data stored in memory or receiving data to be stored in memory.

In one example, system 900 includes one or more input/output (I/O) interface(s) 960. I/O interface 960 can include one or more interface components through which a user interacts with system 900 (e.g., audio, alphanumeric, tactile/touch, or other interfacing). Peripheral interface 970 can include any hardware interface not specifically mentioned above. Peripherals refer generally to devices that connect dependently to system 900. A dependent connection is one where system 900 provides the software platform or hardware platform or both on which operation executes, and with which a user interacts.

In one example, system 900 includes storage subsystem 980 to store data in a nonvolatile manner. In one example, in certain system implementations, at least certain components of storage 980 can overlap with components of memory subsystem 920. Storage subsystem 980 includes storage device(s) 984, which can be or include any conventional medium for storing large amounts of data in a nonvolatile manner, such as one or more magnetic, solid state, or optical based disks, or a combination. Storage 984 holds code or instructions and data 986 in a persistent state (i.e., the value is retained despite interruption of power to system 900). Storage 984 can be generically considered to be a "memory," although memory 930 is typically the executing or operating memory to provide instructions to processor 910. Whereas storage 984 is nonvolatile, memory 930 can include volatile memory (i.e., the value or state of the data is indeterminate if power is interrupted to system 900). In one example, storage subsystem 980 includes controller 982 to interface with storage 984. In one example controller 982 is a physical part of interface 914 or processor 910, or can include circuits or logic in both processor 910 and interface 914.

Power source 902 provides power to the components of system 900. More specifically, power source 902 typically interfaces to one or multiple power supplies 904 in system 900 to provide power to the components of system 900. In one example, power supply 904 includes an AC to DC (alternating current to direct current) adapter to plug into a wall outlet. Such AC power can be renewable energy (e.g., solar power) power source 902. In one example, power source 902 includes a DC power source, such as an external AC to DC converter. In one example, power source 902 or power supply 904 includes wireless charging hardware to charge via proximity to a charging field. In one example, power source 902 can include an internal battery or fuel cell source.

Reference to storage devices can refer to a nonvolatile memory device whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Figure 10:
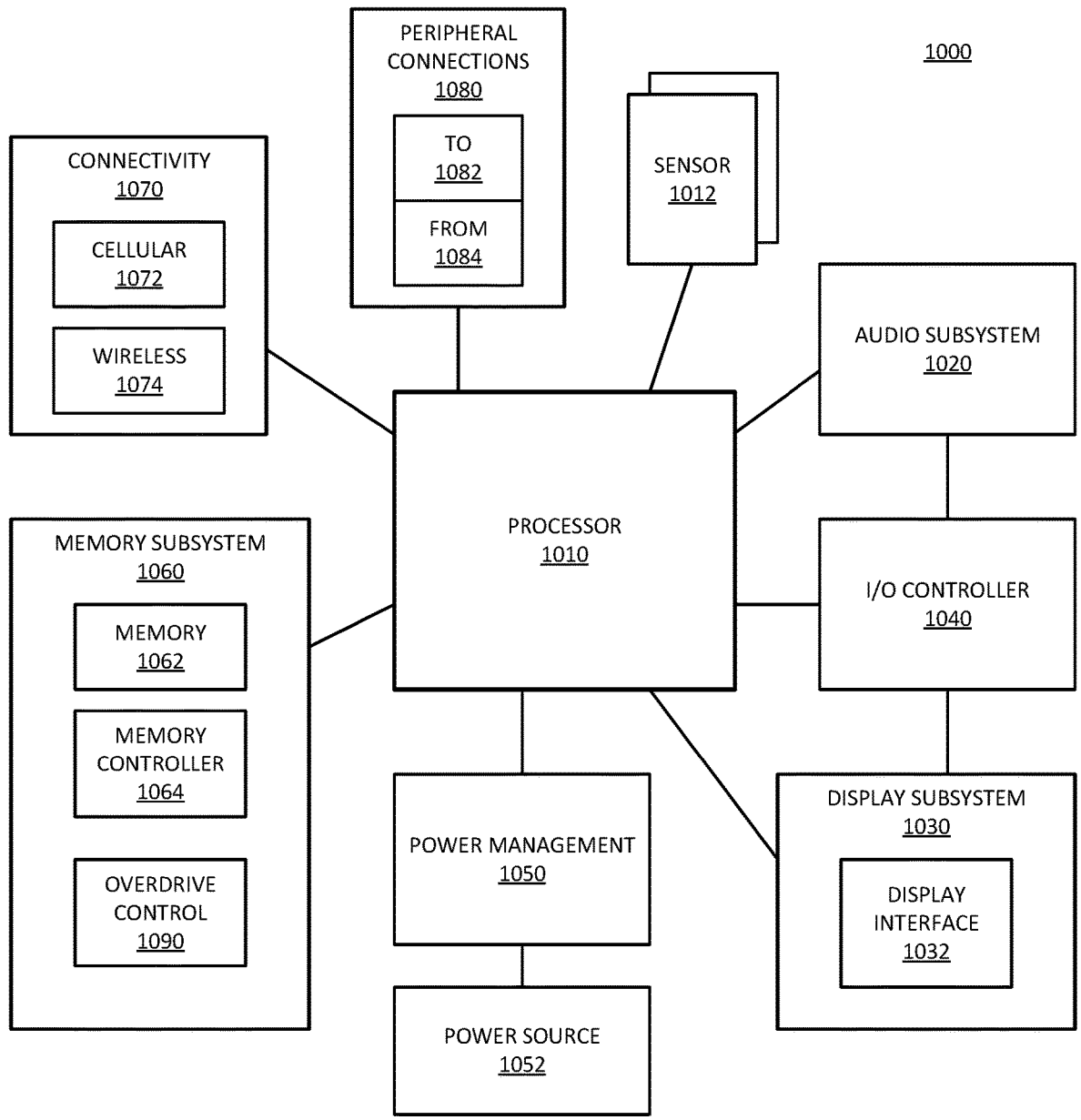
FIG. 10 is a block diagram of an example of a mobile device in which a decoder with overdrive bias control can be implemented.

FIG. 10 is a block diagram of an example of a mobile device in which a decoder with overdrive bias control can be implemented. System 1000 represents a mobile computing device, such as a computing tablet, a mobile phone or smartphone, wearable computing device, or other mobile device, or an embedded computing device. It will be understood that certain of the components are shown generally, and not all components of such a device are shown in system 1000.

In one example, system 1000 includes overdrive control 1090 in memory subsystem 1060. Typically, overdrive control as described herein is applied to a nonvolatile storage where a memory array is programmed by a sequence of program or write pulses. The overdrive control can perform overdrive in accordance with any example herein. The overdrive control applies a higher bias voltage, floats the bias voltage to the higher voltage while the access device is not loaded, and then loads the access device to connect the global line to the local lines to apply the program voltage to the bitcells of the memory array.

System 1000 includes processor 1010, which performs the primary processing operations of system 1000. Processor 1010 can include one or more physical devices, such as microprocessors, application processors, microcontrollers, programmable logic devices, or other processing means. The processing operations performed by processor 1010 include the execution of an operating platform or operating system on which applications and device functions are executed. The processing operations include operations related to I/O (input/output) with a human user or with other devices, operations related to power management, operations related to connecting system 1000 to another device, or a combination. The processing operations can also include operations related to audio I/O, display I/O, or other interfacing, or a combination. Processor 1010 can execute data stored in memory. Processor 1010 can write or edit data stored in memory.

In one example, system 1000 includes one or more sensors 1012. Sensors 1012 represent embedded sensors or interfaces to external sensors, or a combination. Sensors 1012 enable system 1000 to monitor or detect one or more conditions of an environment or a device in which system 1000 is implemented. Sensors 1012 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1012 can also include sensors for biometric systems such as fingerprint recognition systems, face detection or recognition systems, or other systems that detect or recognize user features. Sensors 1012 should be understood broadly, and not limiting on the many different types of sensors that could be implemented with system 1000. In one example, one or more sensors 1012 couples to processor 1010 via a frontend circuit integrated with processor 1010. In one example, one or more sensors 1012 couples to processor 1010 via another component of system 1000.

In one example, system 1000 includes audio subsystem 1020, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 1000, or connected to system 1000. In one example, a user interacts with system 1000 by providing audio commands that are received and processed by processor 1010.

Display subsystem 1030 represents hardware (e.g., display devices) and software components (e.g., drivers) that provide a visual display for presentation to a user. In one example, the display includes tactile components or touchscreen elements for a user to interact with the computing device. Display subsystem 1030 includes display interface 1032, which includes the particular screen or hardware device used to provide a display to a user. In one example, display interface 1032 includes logic separate from processor 1010 (such as a graphics processor) to perform at least some processing related to the display. In one example, display subsystem 1030 includes a touchscreen device that provides both output and input to a user. In one example, display subsystem 1030 includes a high definition (HD) or ultra-high definition (UHD) display that provides an output to a user. In one example, display subsystem includes or drives a touchscreen display. In one example, display subsystem 1030 generates display information based on data stored in memory or based on operations executed by processor 1010 or both.

I/O controller 1040 represents hardware devices and software components related to interaction with a user. I/O controller 1040 can operate to manage hardware that is part of audio subsystem 1020, or display subsystem 1030, or both. Additionally, I/O controller 1040 illustrates a connection point for additional devices that connect to system 1000 through which a user might interact with the system. For example, devices that can be attached to system 1000 might include microphone devices, speaker or stereo systems, video systems or other display device, keyboard or keypad devices, or other I/O devices for use with specific applications such as card readers or other devices.

As mentioned above, I/O controller 1040 can interact with audio subsystem 1020 or display subsystem 1030 or both. For example, input through a microphone or other audio device can provide input or commands for one or more applications or functions of system 1000. Additionally, audio output can be provided instead of or in addition to display output. In another example, if display subsystem includes a touchscreen, the display device also acts as an input device, which can be at least partially managed by I/O controller 1040. There can also be additional buttons or switches on system 1000 to provide I/O functions managed by I/O controller 1040.

In one example, I/O controller 1040 manages devices such as accelerometers, cameras, light sensors or other environmental sensors, gyroscopes, global positioning system (GPS), or other hardware that can be included in system 1000, or sensors 1012. The input can be part of direct user interaction, as well as providing environmental input to the system to influence its operations (such as filtering for noise, adjusting displays for brightness detection, applying a flash for a camera, or other features).

In one example, system 1000 includes power management 1050 that manages battery power usage, charging of the battery, and features related to power saving operation. Power management 1050 manages power from power source 1052, which provides power to the components of system 1000. In one example, power source 1052 includes an AC to DC (alternating current to direct current) adapter to plug into a wall outlet. Such AC power can be renewable energy (e.g., solar power, motion based power). In one example, power source 1052 includes only DC power, which can be provided by a DC power source, such as an external AC to DC converter. In one example, power source 1052 includes wireless charging hardware to charge via proximity to a charging field. In one example, power source 1052 can include an internal battery or fuel cell source.

Memory subsystem 1060 includes memory device(s) 1062 for storing information in system 1000. Memory subsystem 1060 can include nonvolatile (state does not change if power to the memory device is interrupted) or volatile (state is indeterminate if power to the memory device is interrupted) memory devices, or a combination. Memory 1060 can store application data, user data, music, photos, documents, or other data, as well as system data (whether long-term or temporary) related to the execution of the applications and functions of system 1000. In one example, memory subsystem 1060 includes memory controller 1064 (which could also be considered part of the control of system 1000, and could potentially be considered part of processor 1010). Memory controller 1064 includes a scheduler to generate and issue commands to control access to memory device 1062.

Connectivity 1070 includes hardware devices (e.g., wireless or wired connectors and communication hardware, or a combination of wired and wireless hardware) and software components (e.g., drivers, protocol stacks) to enable system 1000 to communicate with external devices. The external device could be separate devices, such as other computing devices, wireless access points or base stations, as well as peripherals such as headsets, printers, or other devices. In one example, system 1000 exchanges data with an external device for storage in memory or for display on a display device. The exchanged data can include data to be stored in memory, or data already stored in memory, to read, write, or edit data.

Connectivity 1070 can include multiple different types of connectivity. To generalize, system 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1074 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1080 include hardware interfaces and connectors, as well as software components (e.g., drivers, protocol stacks) to make peripheral connections. It will be understood that system 1000 could both be a peripheral device ("to" 1082) to other computing devices, as well as have peripheral devices ("from" 1084) connected to it. System 1000 commonly has a "docking" connector to connect to other computing devices for purposes such as managing (e.g., downloading, uploading, changing, synchronizing) content on system 1000. Additionally, a docking connector can allow system 1000 to connect to certain peripherals that allow system 1000 to control content output, for example, to audiovisual or other systems.

In addition to a proprietary docking connector or other proprietary connection hardware, system 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example, a memory device includes: a conductive line to access addressable storage locations of the memory device; and an access device of a line driver for the conductive line to receive an initial overdrive bias voltage at a gate of the access device to drive a drain of the access device to an initial voltage while a control circuit is not connected to the conductive line, receive a signal to connect the control circuit to the conductive line via another conductive line, and maintain the overdrive bias at the initial voltage after connection of the control circuit to the conductive line via the other conductive line to drive the drain to a final program voltage.

In one example, the conductive line comprises a local wordline, wherein the access device is to selectively connect the local wordline to a global wordline. In one example, the access device comprises a string driver to drive the storage locations. In one example, the access device comprises a row decoder of the memory device. In one example, the final program voltage is lower than the initial voltage. In one example, the access device comprises a block driver, the access device to repeatedly receive the initial overdrive bias voltage and connect the access device to the conductive line over a sequence of multiple program pulses to program storage locations of a block. In one example, the access device is to drive the multiple program pulses with a consistent pulse width equal to a width of pulses of a program sequence made without an overdrive bias, with fewer pulses to program the storage locations than would be needed without the overdrive bias. In one example, the access device is to drive the multiple program pulses with a pulse width shorter than a program pulse made without an overdrive bias. In one example, the access device is to drive the multiple program pulses with a pulse width dynamically varied from pulse to pulse for the sequence of multiple program pulses.

In general with respect to the descriptions herein, in one example, a system includes: a storage controller; and a memory device coupled to receive a control signal from the storage controller, including a conductive line to access addressable storage locations of the memory device; and an access device of a line driver for the conductive line to receive an initial overdrive bias voltage at a gate of the access device to drive a drain of the access device to an initial voltage while a control circuit is not connected to the conductive line, receive a signal to connect the control circuit to the conductive line via another conductive line, and maintain the overdrive bias at the initial voltage after connection of the control circuit to the conductive line via the other conductive line to drive the drain to a final program voltage.

In one example, the conductive line comprises a local wordline, wherein the access device is to selectively connect the local wordline to a global wordline. In one example, the access device comprises a string driver to drive the storage locations. In one example, the access device comprises a row decoder of the memory device. In one example, the final program voltage is lower than the initial voltage. In one example, the access device comprises a block driver, the access device to repeatedly receive the initial overdrive bias voltage and connect the access device to the conductive line over a sequence of multiple program pulses to program storage locations of a block. In one example, the access device is to drive the multiple program pulses with a consistent pulse width equal to a width of pulses of a program sequence made without an overdrive bias, with fewer pulses to program the storage locations than would be needed without the overdrive bias. In one example, the access device is to drive the multiple program pulses with a pulse width shorter than a program pulse made without an overdrive bias. In one example, the access device is to drive the multiple program pulses with a pulse width dynamically varied from pulse to pulse for the sequence of multiple program pulses. In one example, a system further includes one or more of: a host processor device coupled to the memory device; a display communicatively coupled to a host processor; a network interface communicatively coupled to a host processor; or a battery to power the system.

In general with respect to the descriptions herein, in one example, a method for programming a storage device includes: applying an initial overdrive bias voltage at a gate of an access device to drive a drain of the access device to an initial voltage while a control circuit is not connected to a conductive line to access addressable storage locations of a memory device; generating a signal to connect the control circuit to the conductive line via another conductive line; and applying the overdrive bias at the initial voltage after connection of the control circuit to the conductive line via the other conductive line to drive the drain to a final program voltage lower.

In one example, the access device comprises a block driver, and comprising repeatedly providing the initial overdrive bias voltage and connecting the access device to the conductive line over a sequence of multiple program pulses to program storage locations of a block; and driving the multiple program pulses with a consistent pulse width equal to a width of pulses of a program sequence made without an overdrive bias, with fewer pulses to program the storage locations than would be needed without the overdrive bias. In one example, the access device comprises a block driver, and comprising repeatedly providing the initial overdrive bias voltage and connecting the access device to the conductive line over a sequence of multiple program pulses to program storage locations of a block; and driving the multiple program pulses with a pulse width dynamically varied from pulse to pulse for the sequence of multiple program pulses.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device comprising:
a conductive line to access storage locations of the memory device; and
an access device of a line driver for the conductive line to receive an initial overdrive bias voltage at a gate of the access device to drive a drain of the access device to an initial voltage while a control circuit is not connected to the conductive line, receive a signal to connect the control circuit to the conductive line via another conductive line, and maintain the overdrive bias voltage at the initial voltage after connection of the control circuit to the conductive line via the other conductive line to drive the drain to a final program voltage.

2. The memory device of claim 1, wherein the conductive line comprises a local wordline, wherein the access device is to selectively connect the local wordline to a global wordline.

3. The memory device of claim 1, wherein the access device comprises a string driver to drive the storage locations.

4. The memory device of claim 1, wherein the access device comprises a row decoder of the memory device.

5. The memory device of claim 1, wherein the final program voltage is lower than the initial voltage.

6. The memory device of claim 1, wherein the access device comprises a block driver, the access device to repeatedly receive the initial overdrive bias voltage and connect the access device to the conductive line over a sequence of multiple program pulses to program storage locations of a block.

7. The memory device of claim 6, wherein the access device is to drive the multiple program pulses with a consistent pulse width equal to a width of pulses of a program sequence made without an overdrive bias voltage, with fewer pulses to program the storage locations than would be needed without the overdrive bias voltage.

8. The memory device of claim 6, wherein the access device is to drive the multiple program pulses with a pulse width shorter than a program pulse made without an overdrive bias.

9. The memory device of claim 6, wherein the access device is to drive the multiple program pulses with a pulse width dynamically varied from pulse to pulse for the sequence of multiple program pulses.

10. A system, comprising:
a storage controller; and
a memory device coupled to receive a control signal from the storage controller, including
a conductive line to access storage locations of the memory device; and
an access device of a line driver for the conductive line to receive an initial overdrive bias voltage at a gate of the access device to drive a drain of the access device to an initial voltage while a control circuit is not connected to the conductive line, receive a signal to connect the control circuit to the conductive line via another conductive line, and maintain the overdrive bias voltage at the initial voltage after connection of the control circuit to the conductive line via the other conductive line to drive the drain to a final program voltage.

11. The system of claim 10, wherein the conductive line comprises a local wordline, wherein the access device is to selectively connect the local wordline to a global wordline.

12. The system of claim 10, wherein the access device comprises a string driver to drive the storage locations.

13. The system of claim 10, wherein the access device comprises a row decoder of the memory device.

14. The system of claim 10, wherein the access device comprises a block driver, the access device to repeatedly receive the initial overdrive bias voltage and connect the access device to the conductive line over a sequence of multiple program pulses to program storage locations of a block.

15. The system of claim 14, wherein the access device is to drive the multiple program pulses with a consistent pulse width equal to a width of pulses of a program sequence made without an overdrive bias voltage, with fewer pulses to program the storage locations than would be needed without the overdrive bias voltage.

16. The system of claim 14, wherein the access device is to drive the multiple program pulses with a pulse width shorter than a program pulse made without an overdrive bias.

17. The system of claim 14, wherein the access device is to drive the multiple program pulses with a pulse width dynamically varied from pulse to pulse for the sequence of multiple program pulses.

18. The system of claim 10, further comprising one or more of:
- a host processor device coupled to the memory device;
- a display communicatively coupled to a host processor;
- a network interface communicatively coupled to a host processor; or
- a battery to power the system.

19. A method for programming a storage device, comprising:
- applying an initial overdrive bias voltage at a gate of an access device to drive a drain of the access device to an initial voltage while a control circuit is not connected to a conductive line to access storage locations of a memory device;
- generating a signal to connect the control circuit to the conductive line via another conductive line; and
- applying the overdrive bias voltage at the initial voltage after connection of the control circuit to the conductive line via the other conductive line to drive the drain to a final program voltage lower.

20. The method of claim 19, wherein the access device comprises a block driver, and comprising
- repeatedly providing the initial overdrive bias voltage and connecting the access device to the conductive line over a sequence of multiple program pulses to program storage locations of a block; and
- driving the multiple program pulses with a consistent pulse width equal to a width of pulses of a program sequence made without an overdrive bias voltage, with fewer pulses to program the storage locations than would be needed without the overdrive bias voltage.

21. The method of claim 19, wherein the access device comprises a block driver, and comprising
- repeatedly providing the initial overdrive bias voltage and connecting the access device to the conductive line over a sequence of multiple program pulses to program storage locations of a block; and
- driving the multiple program pulses with a pulse width dynamically varied from pulse to pulse for the sequence of multiple program pulses.

* * * * *